(12) United States Patent
Fenouillet-Béranger et al.

(10) Patent No.: US 8,936,993 B2
(45) Date of Patent: Jan. 20, 2015

(54) HYBRID SUBSTRATE WITH IMPROVED ISOLATION AND SIMPLIFIED METHOD FOR PRODUCING A HYBRID SUBSTRATE

(75) Inventors: Claire Fenouillet-Béranger, Saint Martin d'Hères (FR); Stéphane Denorme, Crolles (FR); Philippe Coronel, Barraux (FR)

(73) Assignees: Commissariat a l'Energie Atomique et aux Energies Alternatives, Paris (FR); STMicroelectronics (Crolles 2) SAS, Crolles (FR)

( * ) Notice: Subject to any disclaimer, the term of this patent is extended or adjusted under 35 U.S.C. 154(b) by 586 days.

(21) Appl. No.: 12/976,250

(22) Filed: Dec. 22, 2010

(65) Prior Publication Data
US 2011/0147881 A1 Jun. 23, 2011

(30) Foreign Application Priority Data
Dec. 22, 2009 (FR) .................................... 09 06233

(51) Int. Cl.
*H01L 21/76* (2006.01)
*H01L 21/762* (2006.01)
(52) U.S. Cl.
CPC ............................. *H01L 21/76264* (2013.01)
USPC ................... 438/400; 257/506; 257/E21.088; 257/E29.004

(58) Field of Classification Search
USPC ............ 438/400; 257/506, E21.088, E29.004
See application file for complete search history.

(56) References Cited

U.S. PATENT DOCUMENTS

| | | | |
|---|---|---|---|
| 2004/0256700 A1 | 12/2004 | Doris et al. | |
| 2005/0070077 A1* | 3/2005 | Guarini et al. | 438/479 |
| 2005/0116290 A1 | 6/2005 | De Souza et al. | |
| 2005/0236687 A1 | 10/2005 | Chan et al. | |
| 2006/0024931 A1* | 2/2006 | Chan et al. | 438/528 |
| 2008/0057610 A1* | 3/2008 | Lee et al. | 438/52 |
| 2008/0274594 A1* | 11/2008 | Karve et al. | 438/153 |
| 2008/0274595 A1* | 11/2008 | Spencer et al. | 438/154 |

\* cited by examiner

*Primary Examiner* — Thao X. Le
*Assistant Examiner* — Matthew Gordon
(74) *Attorney, Agent, or Firm* — Oliff PLC

(57) ABSTRACT

A hybrid substrate comprises first and second active areas made from semiconductor materials laterally offset from one another and separated by an isolation area. The main surfaces of the isolation area and of the first active area form a plane. The hybrid substrate is obtained from a source substrate successively comprising layers made from a first and second semiconductor materials separated by an isolation layer. A single etching mask is used to pattern the isolation area, first active area and second active area. The main surface of the first active area is released thereby forming voids in the source substrate. The etching mask is eliminated above the first active area. A first isolation material is deposited, planarized and etched until the main surface of the first active area is released.

18 Claims, 8 Drawing Sheets

US 8,936,993 B2

HYBRID SUBSTRATE WITH IMPROVED ISOLATION AND SIMPLIFIED METHOD FOR PRODUCING A HYBRID SUBSTRATE

BACKGROUND OF THE INVENTION

The invention relates to a method for producing a hybrid substrate comprising at least a first active area made from a first semiconductor material and a second active area made from a second semiconductor material, from a source substrate, the first and second active areas being laterally offset and separated by an isolation area made from a first isolation material, the source substrate successively comprising at least one layer made from a first semiconductor material and one layer made from a second semiconductor material separated by an isolation layer made from a second isolation material, the layer made from a first semiconductor material being arranged between the isolation layer and a support layer.

The invention also relates to a hybrid substrate comprising:
  a first active area made from a first semiconductor material,
  a second active area made from a second semiconductor material,
  the first and second active areas being arranged laterally on each side of an isolation area made from a first isolation material,
  the first and second semiconductor materials being separated by an isolation layer made from a second isolation material in a direction perpendicular to a main surface of a support layer.

STATE OF THE ART

The use of field-effect transistors formed on substrates of silicon-on-insulator type presents a large number of advantages, in particular simplification of design of the integrated circuits and improvement of the performances of the devices. In addition, in order to meet ever increasing constraints, the substrates used present increasingly thin thicknesses of silicon and buried oxide.

However, using a transistor integrated on a thin film also presents numerous drawbacks. Field-effect devices are for example unsuitable for use of high currents which are typically to be found in input/output modules. It is also difficult to integrate a bipolar transistor on a thin semiconductor-on-insulator substrate, which limits the scope of possibilities for devices able to be used in integrated circuits.

For increased latitude to be allowed in design of integrated circuits, hybrid substrates are used. As illustrated in FIG. 1, these hybrid substrates comprise a first active area 1 made from a first semiconductor material 2, typically a semiconductor-on-insulator area and a second active area 3 made from a second semiconductor material 4 which is of bulk substrate type. First 1 and second 3 active areas are separated laterally by an isolation area 5.

As illustrated in FIG. 2, these hybrid substrates are produced from a source substrate of semiconductor on insulator type which is transformed so as to present the two types of active areas 1, 3. The source substrate comprises an isolation layer 6 which is arranged between the first and second semiconductor materials. These two types of active areas are then used to form different devices. A conventional way of producing such a hybrid substrate is to etch second semiconductor material 4 and isolation layer 6 down to first semiconductor material 2, once the isolation areas have been produced. The silicon substrate is thus bared and forms first active area 1. Isolation area 5 sinks into silicon substrate 2 and is higher than the silicon-on-insulator layer of second active area 3. First active area 1 is therefore embedded between the different isolation areas 5.

To release the selected active areas only, the method for producing a hybrid substrate is complicated to implement. It requires alignment of a photolithography and etching step with respect to the different active areas present. Misalignment of the protection step of second active areas 3 leads to parasite patterns being obtained in first 1 and/or second 3 active areas and at least partial elimination of one of the isolation patterns 5 bordering first 1 and/or second 3 active areas. It is therefore apparent that the production method greatly limits the integration possibilities of the structure from an industrial standpoint.

The substrate obtained is not optimal either as it is less practical to use than conventional substrates and the circuits obtained do not have as good a lifetime and efficiency as circuits made on conventional substrates.

OBJECT OF THE INVENTION

The object of the invention is to provide a method for producing a hybrid substrate that is easy to implement and that uses a limited number of photolithographic levels, so as to be robust to cope with the hazards related to the equipment used.

It is a further object of the invention to provide a substrate which is particularly interesting for producing integrated circuits with a high production yield.

The method according to the invention is characterized in that it successively comprises, on the source substrate:
  formation of an etching mask designed to delineate the isolation area, first active area and second active area,
  patterning of the layers made from first and second semiconductor materials and of the layer made from second isolation material to delineate at least the isolation area and the first active area in first semiconductor material, releasing a main surface of the first active area thereby forming voids in the source substrate, the etching mask being eliminated above the first active area,
  filling the voids and the etching mask by the first isolation material,
  planarizing the first isolation material,
  etching the first isolation material until the main surface of the first active area is released.

The substrate according to the invention is characterized in that the isolation area comprises a first portion bordering at least one side edge of the first active area, the first portion and the first active area having a free main surface forming one and the same plane, the isolation area and first active area having complementary shapes along an interface between the isolation area and first active area.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF A PREFERRED EMBODIMENT OF THE INVENTION

Figure 1:
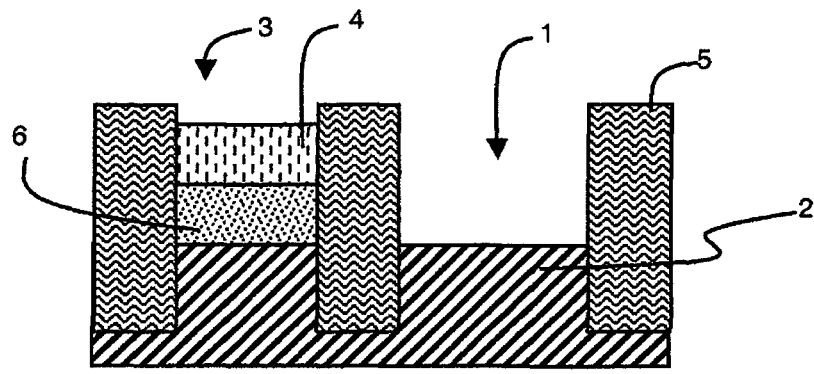
FIG. 1 represents a schematic cross-section of a hybrid substrate according to the prior art.
Figure 2:
FIG. 2 represents a schematic cross-section of a source substrate according to the prior art, FIGS. 3, 4, 5, 19 and 20 schematically represent the steps of a method for producing a hybrid substrate according to the invention, in cross-section and in top view, FIGS. 6 to 10 schematically represent different variants of a first embodiment of the method according to the invention, in cross-section, FIGS. 11 to 18 and 21 schematically represent different variants of a second embodiment of the method according to the invention, in cross-section.

As illustrated in FIG. 2, the initial substrate is a source substrate which comprises at least one layer made from a first semiconductor material 2, a layer made from a second semiconductor material 4 and an isolation layer 6. The source substrate also comprises a support layer 7.

The layer made from first semiconductor material 2 can be formed at the surface of support layer 7 or be formed by a surface area of support layer 7, i.e. in support layer 7 (FIG. 2). The layer made from first semiconductor material 2 can also be of semiconductor-on-insulator type, for example of partially depleted type. Layer 2 is then separated from support layer 7 by a dielectric material called buried dielectric (not shown). First semiconductor material 2 can thereby be made from the same material as support layer 7 or from a different material. It is also conceivable for support layer 7 and first semiconductor material 2 to present the same crystallographic orientation or different orientations.

The layer made from second semiconductor material 4 is separated from the layer made from first semiconductor material 2 by at least one isolation layer 6. Second semiconductor material 4 is therefore of semiconductor-on-insulator type. Second semiconductor material 4 is separated from support layer 7 at least by isolation layer 6 if first semiconductor material 2 is made directly on the surface of support layer 7. First 2 and second 4 semiconductor materials can be identical or different materials and present identical or different orientations.

Thus, in a cross-sectional view and whatever the stack used, the source substrate successively comprises at least support layer 7, the layer made from first semiconductor material 2, isolation layer 6 and the layer made from second semiconductor material 4. The source substrate can also comprise additional layers made from semiconductor materials and additional isolation layers. However, whatever the embodiment, the layer made from first semiconductor material 2 is arranged between support layer 7 and isolation layer 6. Likewise, isolation layer 6 is arranged between first 2 and second 4 semiconductor materials. The source substrate can therefore be of semiconductor-on-insulator type.

As the hybrid substrate is to be used to produce integrated circuits, it is advantageous to limit the height difference between the main surface of first active area 1 made from first semiconductor material 2 and the main surface of second active area 3 made from second semiconductor material 4 as far as possible. The main surface of the active areas is the surface on which a transistor or an electronic device in general is formed. The greater this height difference the more difficult it is to perform the high-quality photolithography steps because of the field depth limitations of the equipment used.

Figure 3:
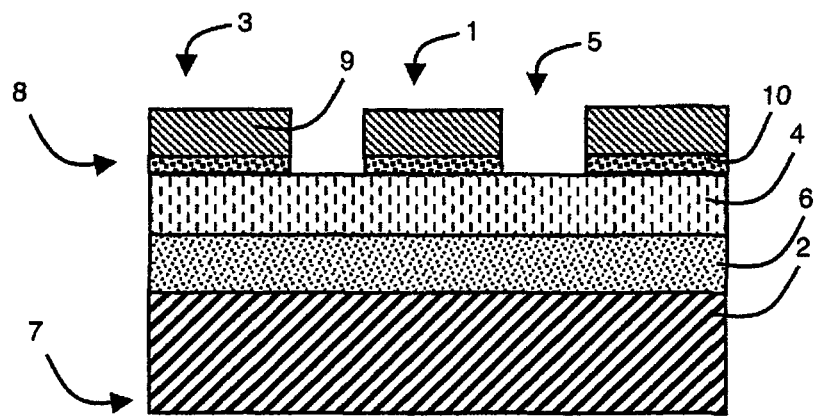

As illustrated in FIG. 3, an etching mask 8 is formed on the source substrate, i.e. on the layer the farthest away from support layer 7, here second semiconductor material 4. For example purposes, the etching mask is formed in a hard mask made from first protective material 9. In an alternative embodiment, etching mask 8 comprises at least a first protective material 9 which covers an additional protective material 10. Depending on the embodiments, first protective material 9 and additional protective material 10 can present different patterns.

The hard mask is patterned so as to form etching mask 8. Etching mask 8 delineates at least a first active area 1 of the substrate, a second active area 3 of the substrate and an isolation area 5 of the substrate. The etching mask can delineate (define the limits or the borders of) a plurality of first active areas 1, second active areas 3 and isolation areas 5. First 1 and second 3 active areas and isolation area 5 being formed in the etching mask, they are compulsorily laterally offset from one another. An isolation area 5 separates first 1 and second 3 active areas. In other words, in an integrated circuit, first active area 1 and second active area 3 are surrounded by an isolation area 5 as illustrated in top view in FIG. 4. In etching mask 8, delineation of isolation area 5 is defined by a void area whereas delineation of first 1 and second 3 active areas is achieved by a solid area. It is however conceivable to produce an etching mask of opposite polarity and to modify this polarity as the steps of the method are performed.

Figure 4:
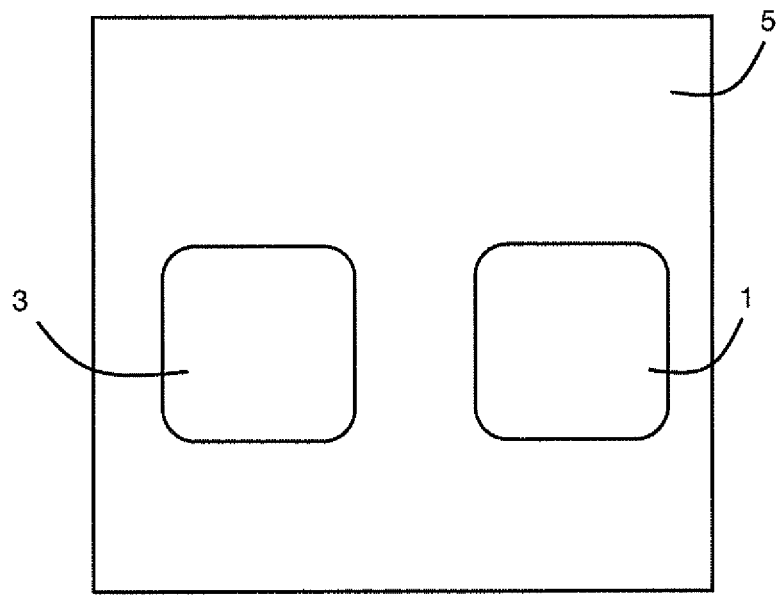

Etching mask 8 therefore comprises distinct patterns delineating first active areas 1, patterns delineating second active areas 3 and patterns delineating isolation areas 5. These three types of patterns represent the whole of the surface of etching mask 5 (FIG. 4).

Figure 5:
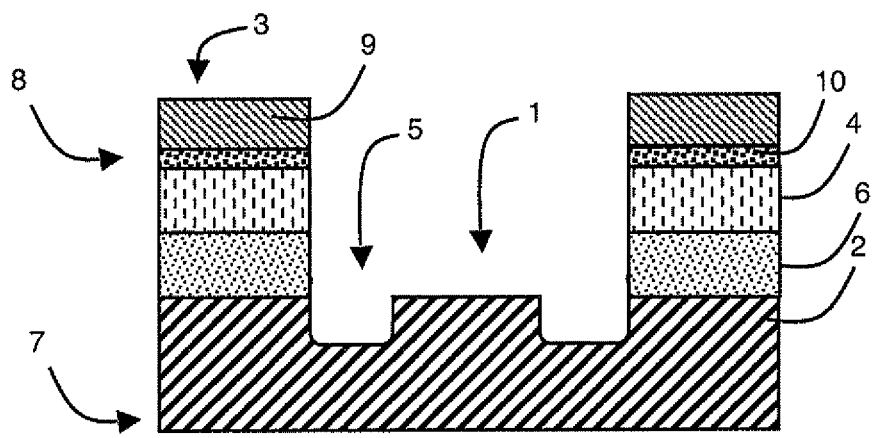

As illustrated in FIG. 5, once etching mask 8 has been produced, the layer made from first semiconductor material 2, the layer made from second semiconductor material 4 and isolation layer 6 are patterned to delineate isolation area 5 in first semiconductor material 2 and to free the main surface of first active area 1 made from first semiconductor material 2. As the main surface of first active area 1 has to be released, isolation layer 6, second semiconductor material 4 and etching mask 8 have to be eliminated above first semiconductor material 2 in the desired zone. Patterning of first semiconductor material 2 at the same time delineates first active area 1 and isolation area 5. The main surface of the first active area corresponds to the surface of the support substrate which formed the interface with the isolation layer. In this way, the main surface of the first active area is underneath the level of isolation layer 6.

When this patterning is performed, first active area 1, isolation area 5 and second active area 3 are delineated. Patterning of etching mask 8 is also performed to eliminate the portion of etching mask 8 which delimits first active area 1. However this patterning of etching mask 8 can be performed at different moments according to the embodiments used.

In conventional manner, to reach first semiconductor material 2, the layer made from second semiconductor material 4 and isolation layer 6 are patterned. This patterning can be performed conventionally by means of plasma etching and it can sink under first semiconductor material 2, for example until it reaches support layer 7.

Figure 6:
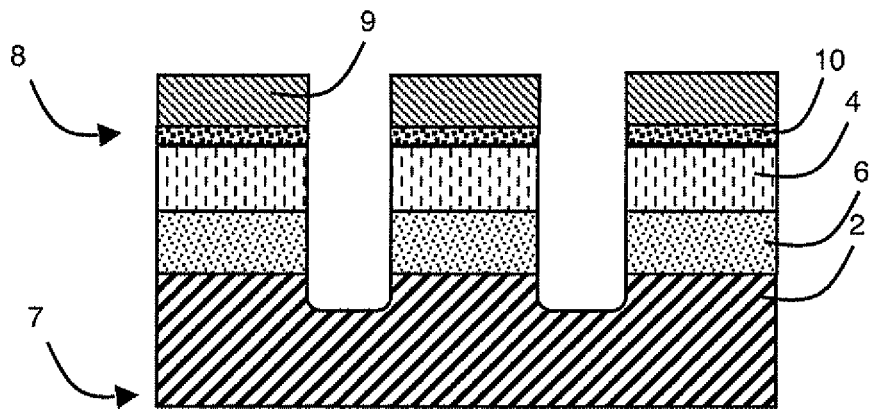

In a first embodiment illustrated in FIG. 6, the free area of etching mask 8 delineates isolation area 5. Second semiconductor material 4, isolation layer 6 and then first semiconductor material 2 are successively patterned from the design represented by the free area of etching mask 8. The design of isolation area 5 is therefore etched in the different layers situated between etching mask 8 and the layer made from first semiconductor material 2. This patterning forms a void area in second semiconductor material 4, isolation layer 6 and first semiconductor material 2. This patterning also delimits second active area 3 made from second semiconductor material 4 at the time etching of this second semiconductor material 4 is performed.

Figure 7:
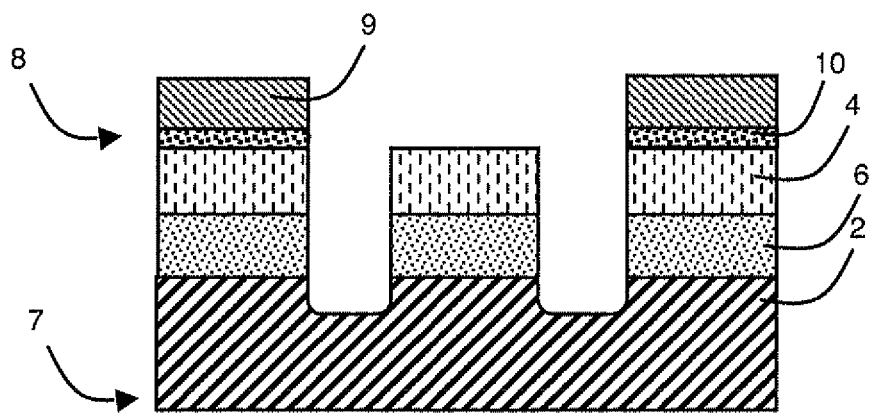

As illustrated in FIG. 7, etching mask 8 is then patterned to be eliminated at the level of first active area 1. Elimination of the portion of etching mask 8 which delineates first active area 1 can be performed by any suitable technique, for example by means of a photolithography and etching step. The main surface of the first active area is then released by eliminating second semiconductor material 4 and isolation layer 6 located just above the first active area. Etching mask 8 can advantageously be used to protect the rest of the substrate when etching is performed.

Figure 8:
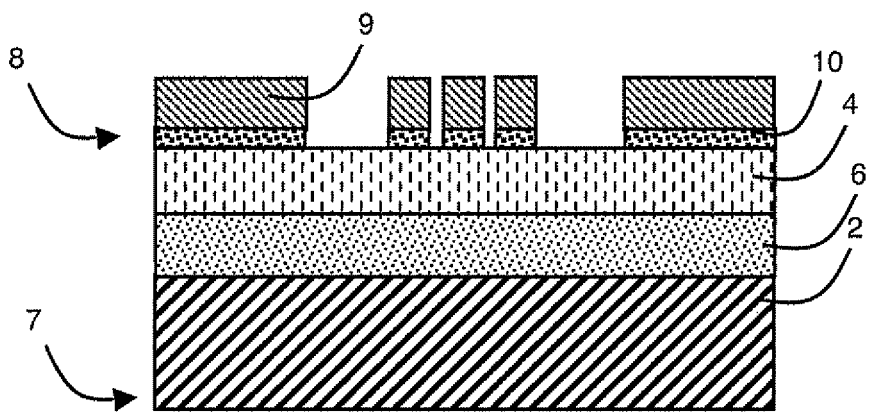

In an advantageous alternative embodiment illustrated in FIG. 8, the design delineating first active area 1 in etching mask 8 is made by means of a plurality of patterns spaced apart from one another. Delineation of first active area 1 is thus performed in etching mask 8 by an alternation of patterns and voids. The distance between two facing side edges of two adjacent patterns is smaller than the smallest distance that exists between a side edge of a pattern delineating first active area 1 and a side edge of a pattern delineating second active area 3. In other words, the largest distance between two adjacent patterns is smaller than the smallest distance that separates the side wall of the pattern delineating the first active area from the side wall of the pattern delineating second active area 3. Furthermore, the lateral and/or longitudinal dimension of the patterns is smaller than the thickness of the etching mask. For example purposes, the patterns are spaced apart by about a third of the distance that normally separates two transistors. In an integration for the 45 nm technological node, the minimum distance that separates two transistors is about 100 nm and the distance that separates two patterns is therefore about 30 nm. For an integration in smaller technological nodes, the distances specified above simply have to be reduced.

The patterns can therefore be of any shape, for example they can be square or rectangular or both. The side wall of the design delineating the first active area is obtained by joining all the patterns situated on the edges. They can be of any size provided that the distance between the patterns is respected.

Figure 9:
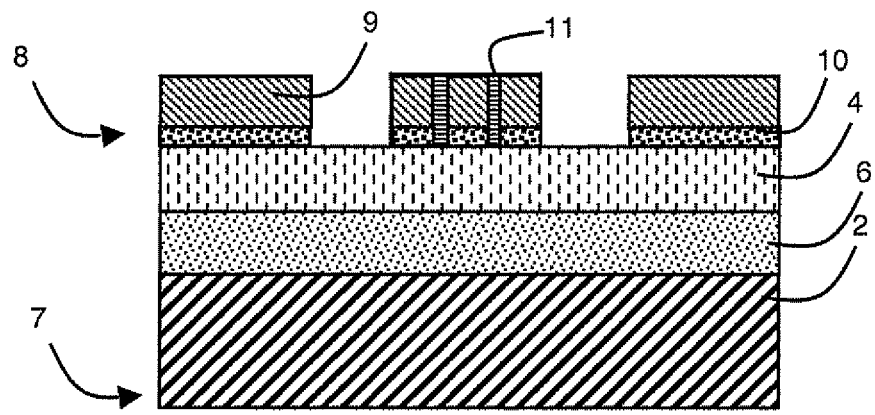

As illustrated in FIG. 9, a first plug 11 is formed in the spaces between the patterns of the design delineating the first active area to form a solid design, i.e. without any voids. First plug 11 is advantageously formed by means of a covering material deposited conformally, i.e. which snugly follows the shape of the material it covers. The space between the patterns being smaller than space between first active area 1 and second active area 3, the covering material seals off the void areas of the design of first active area 1 without completely sealing off the design delineating the isolation area, which is also a void area. The thickness of the covering material is chosen accordingly and the covering material is then eliminated isotropically. In this way, the covering material is present only in the design delineating first active area 1. The void area of etching mask 8 then only delineates isolation area 5.

Patterning of second semiconductor material 4, of isolation layer 6 and of first semiconductor material 2 can then be performed. Once patterning has been performed, the covering material is selectively eliminated by any suitable method and the patterns delimiting first active area 1 are eliminated. This elimination is advantageously achieved by means of isotropic etching of the material or materials constituting etching mask 8. A slight retraction of etching mask 8 then occurs at the level of the side walls of the designs of first 1 and second 3 active areas.

In the case where etching mask 8 above first active area 1 comprises an additional protective material 10, elimination of the patterns of the design delineating first active area 1 is performed by means of selective etching of additional protective material 10. This selective etching leads to lift-off of the patterns. It is conceivable for the covering material and the additional protective material 10 to be the same or for them to present a reactivity to the same etching process.

Figure 10:
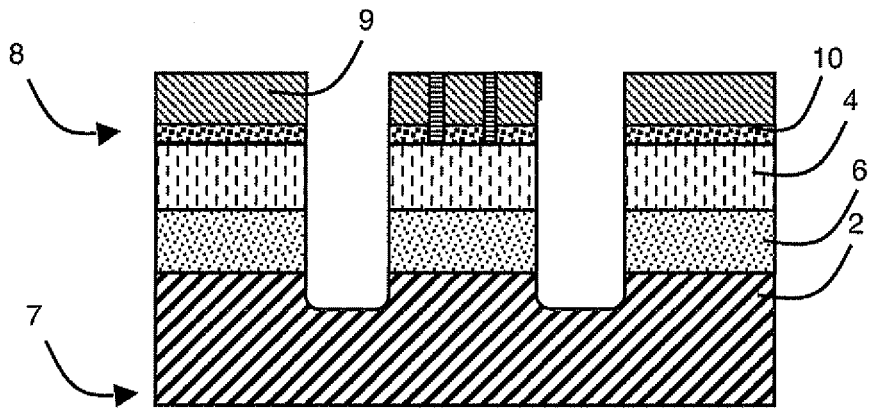

As illustrated in FIG. 10, once the design of etching mask 8 delineating first active area 1 has been eliminated, the parts of second semiconductor material 2 and of isolation layer 6 delineating first active area 1 are also eliminated. Thus, once isolation area 5 has been defined in first semiconductor material 2, all the materials which are to be found above first active area 1 made from first semiconductor material 2 are removed, including etching mask 8, to release the main surface of first active area 1.

Figure 11:
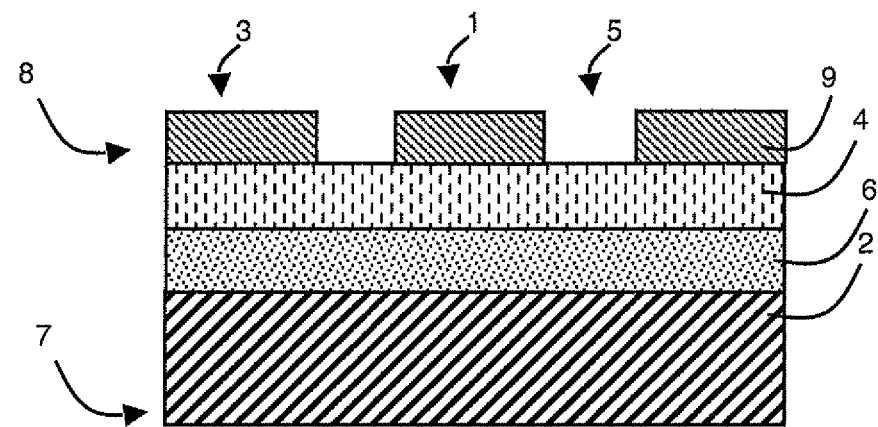
Figure 12:
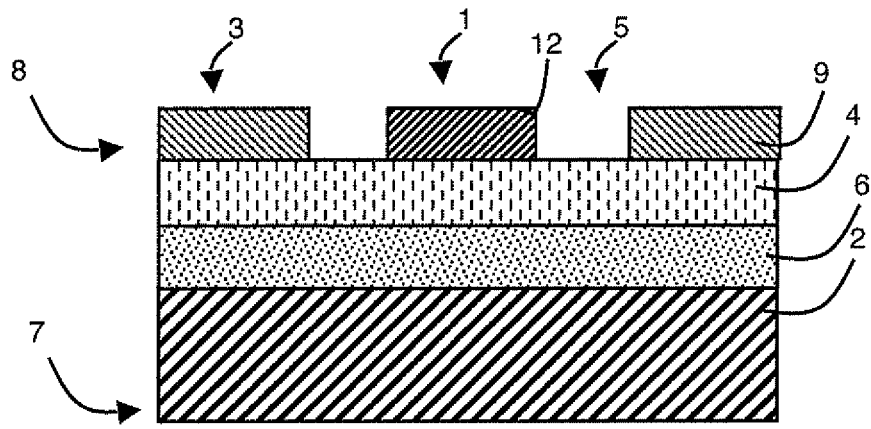

In an alternative embodiment illustrated in FIGS. 11 and 12, first protective material 9 is replaced by a second protective material 12 only in the design delineating first active area 1. This second protective material 12 presents an etching selectivity with respect to first protective material 9. Second protective material 12 can be formed by any suitable technique, for example by implantation of a dopant or of another material in first protective material 9 at the level of the area to be transformed.

Figure 13:
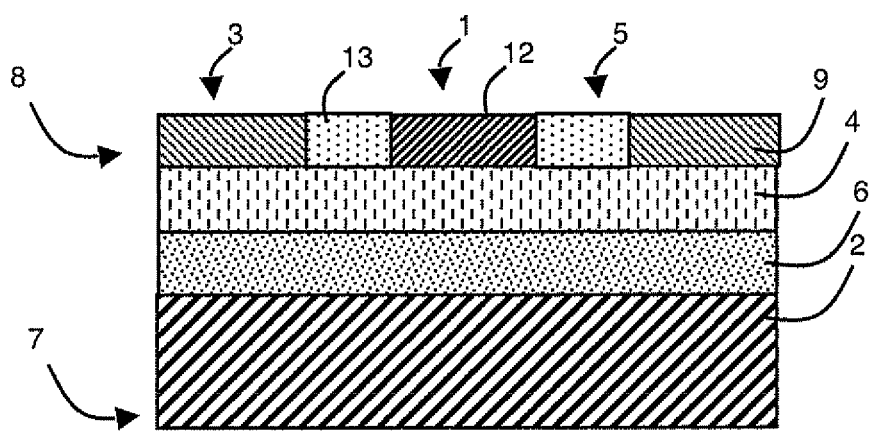

In another alternative embodiment illustrated in FIG. 13, a second plug 13 is formed in etching mask 8 at the level of the design delineating isolation area 5. Second plug 13 then delineates the isolation area in etching mask 8. After the first protective material has been eliminated at the level of the design delineating the first active area, second protective material 12 is formed in the void area of etching mask 8.

In yet another alternative embodiment, the etching mask comprises first protective material 9 formed on additional protective material 10. Second protective material 12 is then formed by additional protective material 10 after elimination of first protective material 9. Advantageously, the second plug is used to prevent lateral etching of the designs delineating first 1 and second 3 active areas.

In all these embodiments, etching mask 8 then delineates first active area 1, second active area 3 and isolation area 5 by means of three different materials which can present thickness differences from one to the other.

Figure 14:
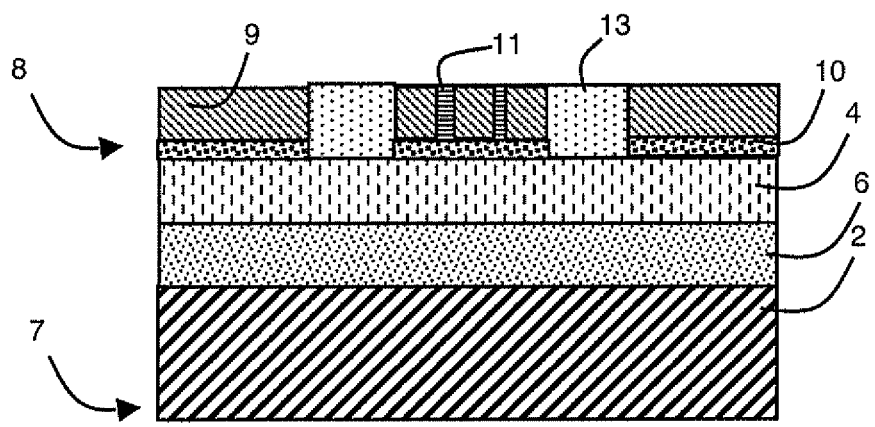
Figure 15:
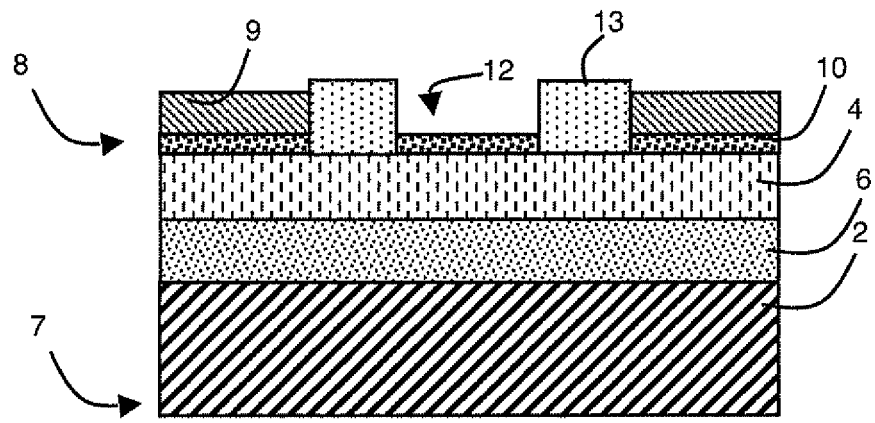
Figure 16:
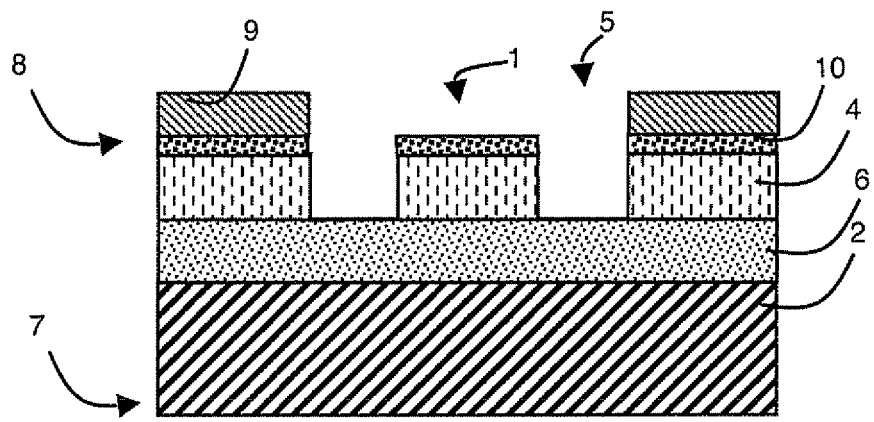
Figure 17:
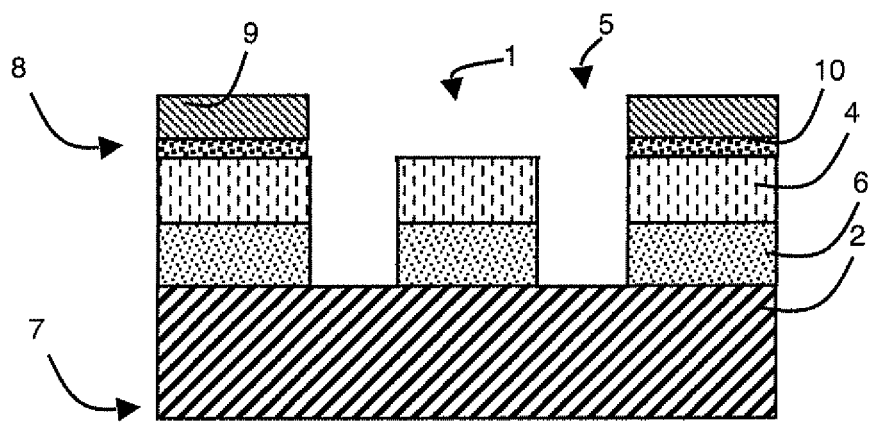
Figure 18:
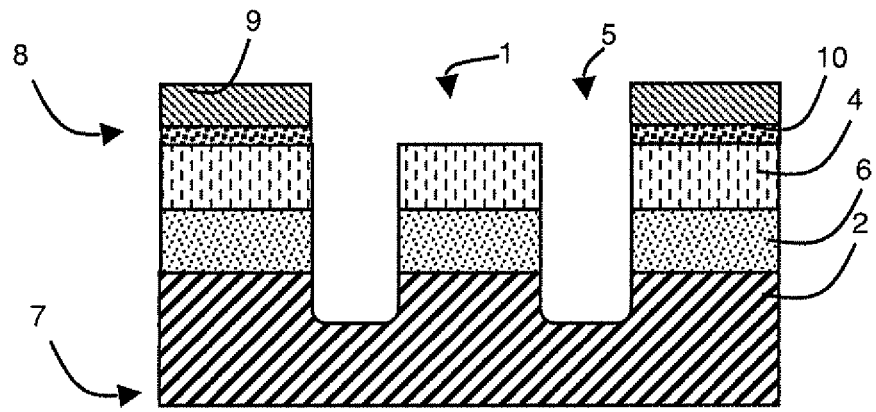

As in a previous embodiment, the design of etching mask 8 delineating first active area 1 can be formed by a plurality of patterns spaced apart from one another which present the same dimensional constraints as before. First plug 11 is then formed before formation of second protective material 12. In an advantageous alternative embodiment illustrated in FIGS. 14 and 15, etching mask 8 comprises a first protective material 9 deposited above an additional protective material 10. First plug 11 is formed before second plug 13. Additional protective layer 10 is patterned once the first plug has been formed. First plug 11 is eliminated and the first protective material is eliminated at the level of the design of the first active area by means of anisotropic etching. In this way, the thickness of first protective material 9 is slightly reduced in etching mask 8 and the design of the first active area made from first protective material 9 is eliminated (FIG. 15). Second plug 13 is then eliminated and the substrate is substantially identical to that of FIG. 12, the thickness of etching mask 8 above the active area being smaller.

As illustrated in FIG. 13, once the second protective material has been formed, second plug 13 is eliminated and isolation area 5 is patterned in the first semiconductor material. The layers situated above the first active area made from first semiconductor material are then removed.

Figure 21:
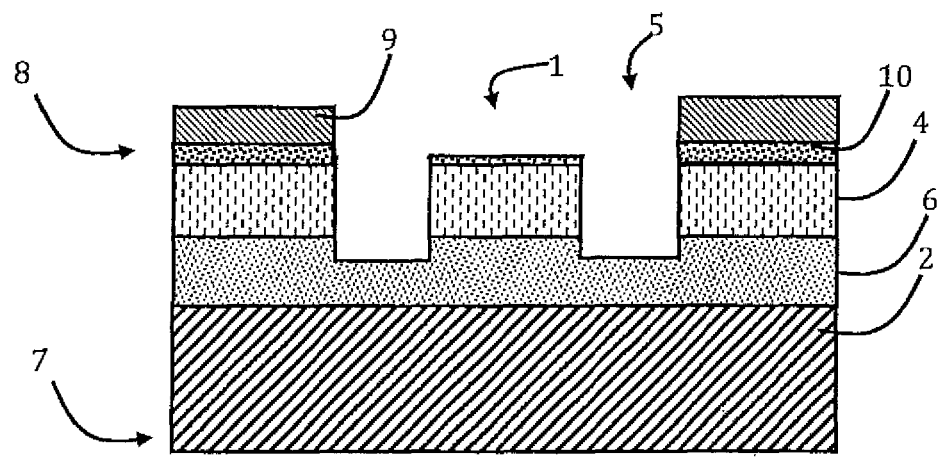

In an advantageous embodiment illustrated in FIGS. 16 to 18 and 21, second protective material 12 is the same material as that of isolation layer 6 or is a material which is etched with the same etching method. In this way, etching mask 8 made from first 9 and second 12 protective materials is used to pattern second semiconductor material 4 and to delimit isolation area 5 and second active area 3 in second semiconductor material 4. Isolation layer 6 is then patterned to delineate isolation area 5. Referring to FIG. 21, isolation layer 6 and second protective material 12 being reactive to the same etching method, second protective material 12 is eliminated at the level of first active area 1. First semiconductor material 2 is then patterned to delineate isolation area 5 and therefore first active area 1 by means of the pattern made of isolation layer 6 delineating first active area 1. The pattern made of isolation layer 6 is then eliminated.

In this embodiment, the patternings are achieved by means of anisotropic etchings which reproduce the design of first active area 1 originating from etching mask 8 in the bottom layer.

In all these embodiments, patterning of isolation layer 6, and of layer made from first semiconductor material 2 and layer made from second semiconductor material 4, and releasing of the main surface of first active area 1 forms voids in the source substrate. These voids are located in second semiconductor material 4, in isolation layer 6 and in first semiconductor material 2. The voids are also present in etching mask 8.

In etching mask 8, in second semiconductor material 4 and in isolation layer 6, the voids correspond to the surface of first active area 1 and of isolation area 5. In first semiconductor material 1, the void corresponds only to isolation area 5.

Figure 19:
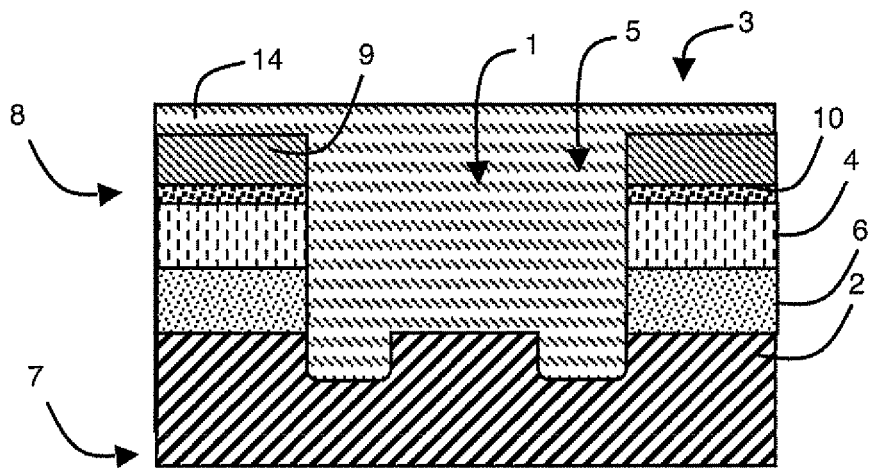

As illustrated in FIG. 19, in all the embodiments, a first isolation material 14 is deposited so as to fill the void areas of the source substrate and etching mask 8. This first isolation material 14 is an electrically insulating material, for example silicon oxide or silicon nitride. First isolation material 14 can be different from the second isolation material constituting isolation layer 6. The first and second isolation materials can also be identical.

First isolation material 14 fills in the isolation area formed in first semiconductor material 2, but also fills the void area representative of isolation area 5 and of first active area 1 in isolation layer 6 and in second semiconductor material 4. First isolation material 14 is also deposited on etching mask 8.

First isolation material 14 undergoes advantageously a planarizing step, this step being able to stop above the level of etching mask 8. During this operation, the etching mask can also be etched, but damaging the main surface of second semiconductor material 4 must be avoided. Once first isolation material 14 has been planarized, it undergoes an isotropic or anisotropic etching step in order to localize it at the level of isolation area 5 inside first semiconductor material 2. In this etching step, the planarity of the first isolation material is preserved throughout etching. If isolation layer 6 or another of the layers present and accessible is reactive to the etching process of first isolation material 14, etching is performed by means of an anisotropic process.

In this way, it is possible to position the top surface of first isolation material 14 where required with respect to the main surface of first active area 1 and/or of second active area 2.

Figure 20:
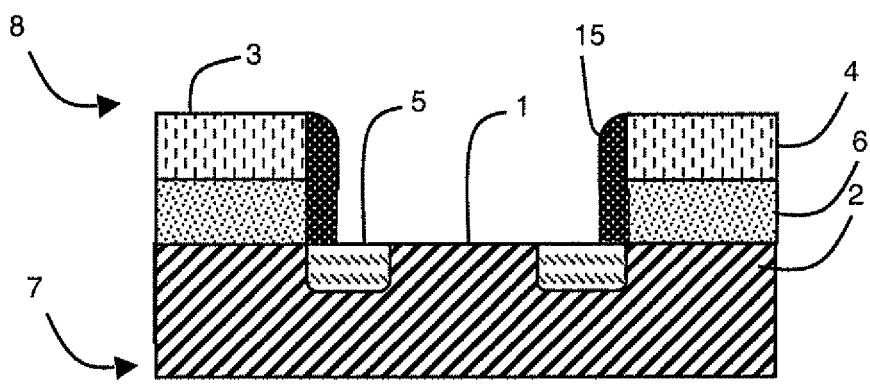

In an advantageous embodiment illustrated in FIG. 20, etching of first isolation material 14 is performed until the main surface of first active area 1 is released. In this case, the main surface of first active area 1 is at exactly the same level as the main surface of isolation area 5 made from first isolation material 14. First active area 1 and isolation area 5 having complementary shapes, no impurity can be deposited at the interface between these two areas and impurities are not stuck on first active area 1, for example because of isolation areas 5 which are higher than the main surface of first active area 1. Furthermore, the transistor formed on first active area 1 does not present any stray transistor as the main surface of first active area 1 is not above the surface of isolation area 5.

It is also possible to deliberately lower the main surface of the isolation area with respect to that of first active area 1. In this case, first isolation material 14 presenting a flat surface, this flat surface is maintained throughout etching, even above the main surface of first active area 1, i.e. after the main surface of first active area 1 has been released.

In an alternative embodiment illustrated in FIG. 20, a lateral spacer 15 is formed on the side edge of second active area 3 made from second semiconductor material 4, above isolation area 5 made from first isolation material 14. Lateral spacer 15 can be formed after localization of first isolation material 14 in isolation area 5 inside first semiconductor material 2.

An additional insulating material is deposited conformally on the substrate. The additional insulating material covers etching mask 8, first active area 1, first isolation material 14 and the side walls of etching mask 8, of second semiconductor material 4 and of isolation layer 6. The additional insulating material is then etched anisotropically by plasma so as to only localize on the side walls and to thereby form lateral spacer 15.

Lateral spacer can also be formed during etching of first isolation material 14. The additional insulating material is deposited conformally on the substrate. The additional insulating material covers etching mask 8, first isolation material 14 and the uncovered side walls. The additional insulating material is then etched anisotropically by plasma so as to localize the latter only on the side walls. Etching of first isolation material 14 is then resumed with an anisotropic etching process and the lateral spacer is formed by the additional insulating material in a top part and by the first isolation material in a bottom part.

The deposited thickness of additional insulating material and the etched thickness depend on the thickness chosen for the lateral spacer.

In yet another alternative embodiment (not represented), it is conceivable to only release a portion of first active area 1. If lateral 15 spacer is formed before the main surface of first active area 1 is released and if the thickness of lateral spacer 15 is greater than the distance separating first 1 and second 3 active areas (the width of isolation area 5), lateral spacer 15 is arranged above first active area 1. It is then possible to use lateral spacer 15 as etching mask and to only release a part of first active area 1. This embodiment is particularly advantageous if it is desired to raise the height of the main surface of first active area 1, for example by selective epitaxy. It should be noted that this embodiment is difficult to implement as it requires a certain number of geometric constraints to obtain a lateral spacer 15 which encroaches on first active area 1 (typically a very thick etching mask). The opening in the first isolation material can also be made by means of an additional photolithography step but there is then a loss of self-alignment of first active area 1 with respect to second active area 3 and to isolation area 5.

Etching mask 8 is then eliminated by any suitable technique, for example by means of anisotropic etching such as wet etching, and the main surface of the second active area is released.

This fabrication method is particularly interesting as it enables first 1 and second 3 active areas and an isolation area 5 to be formed in self-aligned manner. The position, shape and dimensions of the different areas are defined as soon as etching mask 8 is produced.

A hybrid substrate can thereby be obtained comprising a first active area 1 made from first semiconductor material 2, and a second active area 3 made from second semiconductor material 4, first 1 and second 2 active areas being arranged laterally on each side of an isolation area 5 made from first isolation material 14. First 2 and second 4 semiconductor materials are separated by an isolation layer 6 made from a second isolation material in a direction perpendicular to a main surface of a support layer 7. Isolation area 5 further comprises a main surface which forms a single plane with the main surface of first active area 1. Isolation area 5 and first active area 1 have complementary shapes along the interface between isolation area 5 and first active area 1. Second active areas 3 are electrically separated from first active areas 1 by isolation layer 6, from a vertical point of view.

This hybrid substrate is particularly advantageous as it allows specific devices to be formed on active areas presenting predefined electronic and/or crystallographic characteristics. The active areas present an excellent surface quality as they have always been protected from aggressive steps. The main surfaces of the active areas are in general released by means of wet etching. The substrate does not present surface maskwork in immediate proximity to the active areas especially at the level of the first active area. This has the effect of limiting the risks of contamination linked to a cleaning problem and also of limiting stray transistors. The existing maskwork is transferred above the isolation areas which limits the effect of parasite materials on operation of the device.

The invention claimed is:

1. A method for producing a hybrid substrate comprising successively:
   providing a substrate successively comprising a layer made from a first semiconductor material, an isolation layer, a layer made from a second semiconductor material, and an etching mask including first and second covering areas separated by an uncovered area,
   etching the layer made from the second semiconductor material, the isolation layer, and the layer made from the first semiconductor material through the etching mask for delineating an isolation area, and a first active area in the layer made from the first semiconductor material, the first covering area protecting the first active area in the layer made from the first semiconductor material, the second covering area protecting a second active area in the layer made from the second semiconductor material, the first and second active areas being laterally offset,
   releasing a top surface of the second semiconductor material in the first active area,
   depositing a first isolation material so as to cover a main surface of the first active area and fill the etching mask, and
   etching the first isolation material for freeing the main surface of the first active area and simultaneously localizing the first isolation material in the isolation area.

2. The method according to claim 1, wherein, in the etching mask, the first covering area being formed by an alternation of patterns and voids, the distance between two facing side edges of two adjacent patterns is smaller than the smallest distance existing between a side edge of one of the patterns forming the first covering area and a side edge of a pattern forming the second covering area.

3. The method according to claim 2, wherein a first plug is formed in the void areas between the patterns forming the first covering area, the first plug leaving uncovered the uncovered area.

4. The method according to claim 1, wherein the isolation area comprises a lateral spacer which covers at least a side wall of the second active area.

5. The method according to claim 1, further comprising, after depositing the first isolation material and before freeing the main surface of the first active area:
   performing a planarization step so as to form a plane surface of the first isolation material, and
   thinning the first isolation material until the plane surface of the first isolation material releases the main surface of the first active area.

6. The method according to claim 1 wherein the first active area defines a first plane and the second active area defines a second plane different from the first plane.

7. The method according to claim 1, wherein
   releasing the main surface of the first active area is performed by removing the isolation layer so as to remove an interface between the first semiconductor layer and the isolation layer.

8. The method according to claim 1, wherein
   depositing the first isolation material is performed so as to completely fill the etching mask.

9. A method for producing a hybrid substrate comprising successively:
   providing a substrate successively comprising a layer made from a first semiconductor material, an isolation layer, a layer made from a second semiconductor material, and an etching mask including first and second covering areas separated by an uncovered area,
   etching the layer made from the second semiconductor material, through the etching mask for delineating an additional first covering area and a second active area in the layer made from the second semiconductor material, the first covering area protecting a first active area in the layer made from the first semiconductor material and the additional first covering area in the layer made from the second semiconductor material, the second covering area protecting the second active area in the layer made from the second semiconductor material, the first and second active areas being laterally offset,
   removing the first covering area,
   etching the isolation layer and the layer made from the first semiconductor material through the layer made from the second semiconductor material, for delineating an isolation area and the first active area in the layer made from the first semiconductor material,
   releasing a top surface of the first semiconductor material in the first active area,
   depositing a first isolation material so as to cover a main surface of the first active area and fill the etching mask, and
   etching the first isolation material for freeing the main surface of the first active area and simultaneously localizing the first isolation material in the isolation area.

10. The method according to claim 9, wherein the etching mask is made from a first protective material, the method further comprising, before etching the layer made from the first semiconductor material:
    replacing the first protective material in the first covering area by a second protective material, the second protective material being reactive to a same etching process as the isolation layer, and
    etching simultaneously the isolation layer and the first covering area.

11. The method according to claim 9, wherein the etching mask comprises a first protective material deposited on an additional protective material, the method further comprising:
- filling the uncovered area of the etching mask by a first plug,
- eliminating the first protective material in the first covering area, and
- forming a second protective material so as to form the first covering area made from the second protective area.

12. The method according to claim 9, successively further comprising: filling the uncovered area of the etching mask by a first plug, eliminating a first protective material in the first covering area, forming a second protective material so as to form the first covering area made from the second protective area, and eliminating the first plug.

13. The method according to claim 9, wherein, in the etching mask, the first covering area is formed by an alternation of patterns and voids, the distance between two facing side edges of two adjacent patterns is smaller than the smallest distance existing between a side edge of one of the patterns forming the first covering area and a side edge of a pattern forming the second covering area.

14. The method according to claim 13, wherein a second plug is formed in the void areas between the patterns forming the first covering area, the second plug leaving uncovered the uncovered area.

15. The method according to claim 9, wherein the isolation area comprises a lateral spacer which covers at least the side wall of the second active area.

16. The method according to claim 9, further comprising, after depositing the first isolation material and before freeing the main surface of the first active area:
- performing a planarization step so as to form a plane surface of the first isolation material, and
- thinning the first isolation material until the plane surface of the first isolation material releases the main surface of the first active area.

17. The method according to claim 9, wherein
releasing the main surface of the first active area is performed by removing the isolation layer so as to remove an interface between the first semiconductor layer and the isolation layer.

18. The method according to claim 9, wherein
depositing the first isolation material is performed so as to completely fill the etching mask.

* * * * *